US012352610B2

(12) United States Patent
Ito et al.

(10) Patent No.: US 12,352,610 B2
(45) Date of Patent: Jul. 8, 2025

(54) FLOW RATE MEASUREMENT DEVICE

(71) Applicant: Murata Machinery, Ltd., Kyoto (JP)

(72) Inventors: Yasuhisa Ito, Ise (JP); Shinji Onishi, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 199 days.

(21) Appl. No.: 18/028,230

(22) PCT Filed: Aug. 13, 2021

(86) PCT No.: PCT/JP2021/029840
§ 371 (c)(1),
(2) Date: Mar. 24, 2023

(87) PCT Pub. No.: WO2022/074937
PCT Pub. Date: Apr. 14, 2022

(65) Prior Publication Data
US 2024/0192041 A1    Jun. 13, 2024

(30) Foreign Application Priority Data
Oct. 5, 2020  (JP) ................. 2020-168369

(51) Int. Cl.
G01F 15/18    (2006.01)
(52) U.S. Cl.
CPC .................... G01F 15/18 (2013.01)
(58) Field of Classification Search
CPC .......................................... G01F 15/18
USPC ........................................... 73/861
See application file for complete search history.

(56) References Cited

U.S. PATENT DOCUMENTS 4,022,059 A * 5/1977 Schontzler ............... G01N 1/18
73/863.02
2008/0156069 A1* 7/2008 Murata ................. G01D 21/00
73/19.04
2011/0220545 A1* 9/2011 Ra ..................... H01L 21/67389
206/711

(Continued)

FOREIGN PATENT DOCUMENTS

JP    2002-231803 A    8/2002
JP    2008-159734 A    7/2008
(Continued)

OTHER PUBLICATIONS

International Search Report dated Oct. 26, 2021 in counterpart International Application No. PCT/JP2021/029840 w/English translation.
(Continued)

Primary Examiner — Nathaniel T Woodward
(74) Attorney, Agent, or Firm — DLA Piper LLP (US)

(57) ABSTRACT

A flow rate measurement device measures the flow rate of purge gas in a purge device configured to supply the purge gas to a container including a bottom lid configured to be attached to and detached from a container body. The flow rate measurement device includes: a base on which a flow-rate measurer is mounted; an engaged part provided in the base and configured to be engaged with the bottom lid; and a flow passage through which the purge gas injected from an injection port of the bottom lid is circulated to the flow-rate measurer when the engaged part is engaged with the bottom lid.

8 Claims, 11 Drawing Sheets

(56) References Cited

U.S. PATENT DOCUMENTS

| | | | |
|---|---|---|---|
| 2015/0000372 A1* | 1/2015 | Otsuka | G01N 33/0009 73/23.2 |
| 2015/0369643 A1* | 12/2015 | Murata | H01L 21/67769 73/861.08 |
| 2018/0074031 A1* | 3/2018 | Abe | G01F 1/28 |
| 2018/0224311 A1 | 8/2018 | Ueda et al. | |
| 2021/0111048 A1* | 4/2021 | Narita | H01L 21/67373 |

FOREIGN PATENT DOCUMENTS

| | | |
|---|---|---|
| JP | 2015-12040 A | 1/2015 |
| JP | 2018-041925 A | 3/2018 |
| WO | 2014/136506 A1 | 9/2014 |

OTHER PUBLICATIONS

Written Opinion dated Oct. 26, 2021 in counterpart International Application No. PCT/JP2021029840.

* cited by examiner

FLOW RATE MEASUREMENT DEVICE

TECHNICAL FIELD

This disclosure relates to a flow rate measurement device.

BACKGROUND

A flow rate measurement device configured to measure a flow rate of purge gas in a purge device configured to supply the purge gas to a container is known. For example, Japanese Unexamined Patent Publication No. 2008-159734 discloses a technique for measuring the flow rate of purge gas, which additionally uses a flow rate measurement device (FOUP for measurement) having the same shape as that of a container (FOUP for storage).

In the disclosure described above, the flow rate measurement device is manufactured by, for example, preparing a container used for a purge device, cutting and processing the container, and installing a flow-rate measurer and other equipment on the container. Thus, measuring the flow rate of purge gas involves a problem in that much time and labor are required.

It could therefore be helpful to provide a flow rate measurement device that can easily measure the flow rate of purge gas in a purge device.

SUMMARY

A flow rate measurement device is configured to measure a flow rate of purge gas in a purge device configured to supply the purge gas to a container including a bottom lid configured to be attached to and detached from a container body. The flow rate measurement device includes: a base on which a flow-rate measurer is mounted; an engaged part provided in the base and configured to be engaged with the bottom lid; and a flow passage through which the purge gas injected from an injection port of the bottom lid is circulated to the flow-rate measurer when the engaged part is engaged with the bottom lid.

With this flow rate measurement device, when the engaged part is engaged with the bottom lid, the flow rate of purge gas in the purge device can be measured by effectively utilizing an existing function of the injection port, for example, of the bottom lid. Thus, the flow rate of purge gas in the purge device can be easily measured.

The bottom lid may include a latch and be attached to the container body with the latch, and the engaged part may be engaged with the latch. In this example, the engaged part can be engaged with the bottom lid by effectively utilizing the latch of the bottom lid.

The base may include a frame having a frame shape corresponding to an outer shape of the bottom lid and configured to be stacked on the bottom lid to surround an edge of the bottom lid, and the engaged part may be a hole or a groove, formed in the frame, into which the latch is inserted. In this example, the configuration in which the engaged part is engaged with the bottom lid by effectively utilizing the latch can be concretely implemented.

The frame may have a stepped surface configured to be brought into contact with an upper surface of the bottom lid to restrict upward movement of the bottom lid. In this example, the bottom lid can be prevented from moving upward away from the frame, and thus the engaged part can be easily engaged with the bottom lid.

The flow passage may include an inlet pad configured to be brought into intimate contact with a rim of the injection port on the upper surface of the bottom lid when the engaged part is engaged with the bottom lid. In this example, leakage of purge gas can be prevented, and the flow rate of the purge gas can be reliably measured.

The inlet pad may include a first layer provided on a side closer to the injection port and made of elastic material and a second layer stacked on the first layer and made of gel material. In this example, leakage of purge gas can be further prevented.

The base may have a pressing surface disposed opposite to the bottom lid and configured to press the inlet pad, which is in intimate contact with the rim of the injection port, against the bottom lid when the engaged part is engaged with the bottom lid. In this example, leakage of purge gas can be further prevented.

In the base, at least one of a positioning hole into which a positioning projection provided on the bottom lid is inserted and a positioning projection configured to be inserted into a positioning hole provided in the bottom lid may be formed. In this example, the bottom lid can be positioned with respect to the base.

Our flow rate measurement device thus easily measures the flow rate of purge gas in the purge device.

REFERENCE SIGNS LIST

Figure 1:
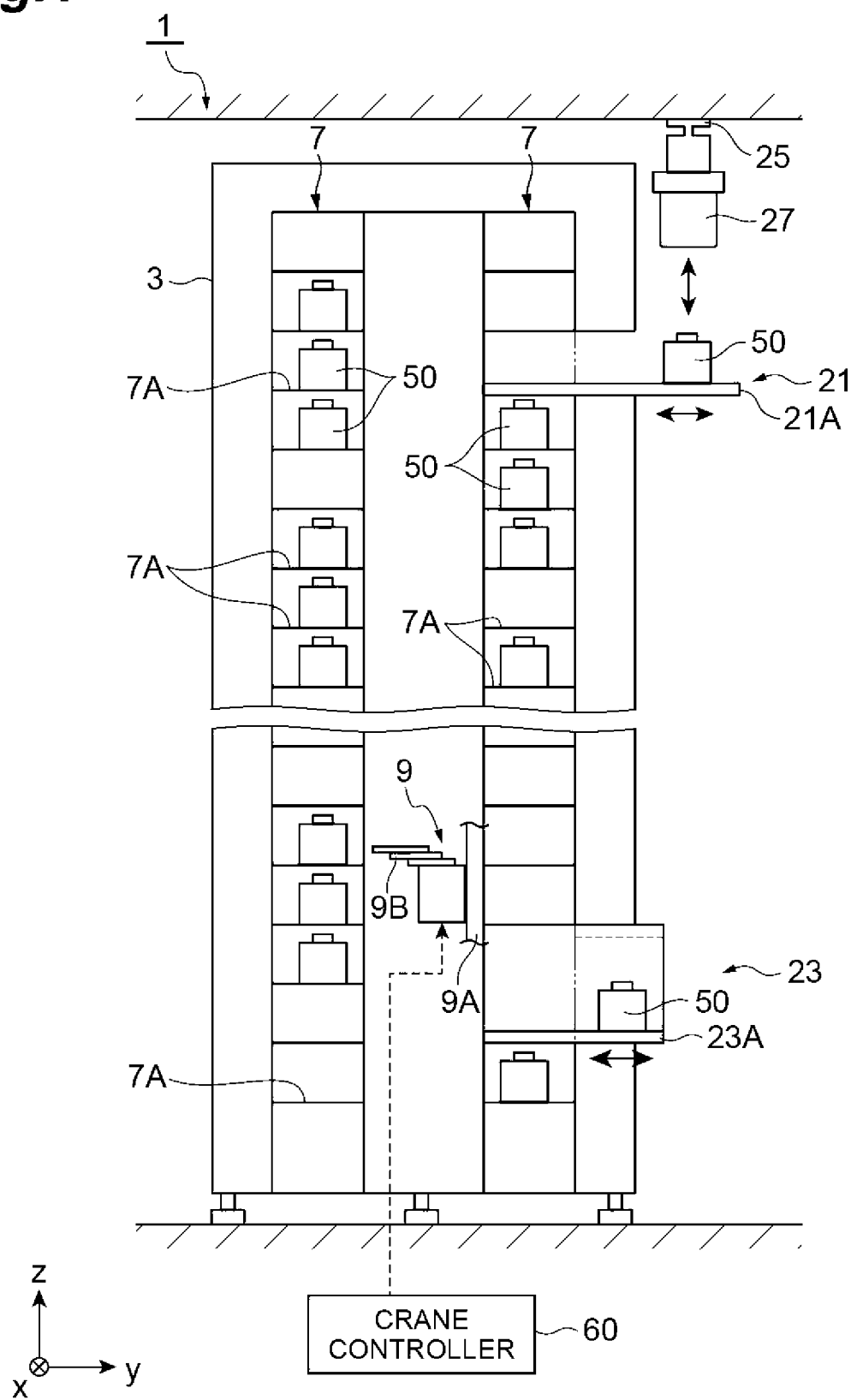
FIG. 1 is a side view of a purge stocker according to an example.

30 purge device
50 storage container (container)
51 container body
52A injection port
53 bottom lid
58A latch
59 positioning projection
100 flow rate measurement device
101 flow-rate measurer
110 frame (base)
111 stepped surface
112*a* pressing surface
113 positioning hole
120 long hole (engaged part, hole)
130 flow passage 133 inlet pad
133x first layer
133y second layer

DETAILED DESCRIPTION

An example will now be described with reference to the drawings. In the description of the drawings, like elements are designated by like reference signs, and duplicate description is omitted. The scale in the drawings does not necessarily coincide with the size of a described object.

A flow rate measurement device measures the flow rate of purge gas in a purge device. The purge device is a device configured to purge the inside of a storage container with purge gas, and is disposed in a purge stocker, for example. First, the purge device and the purge stocker will be described.

Figure 2:
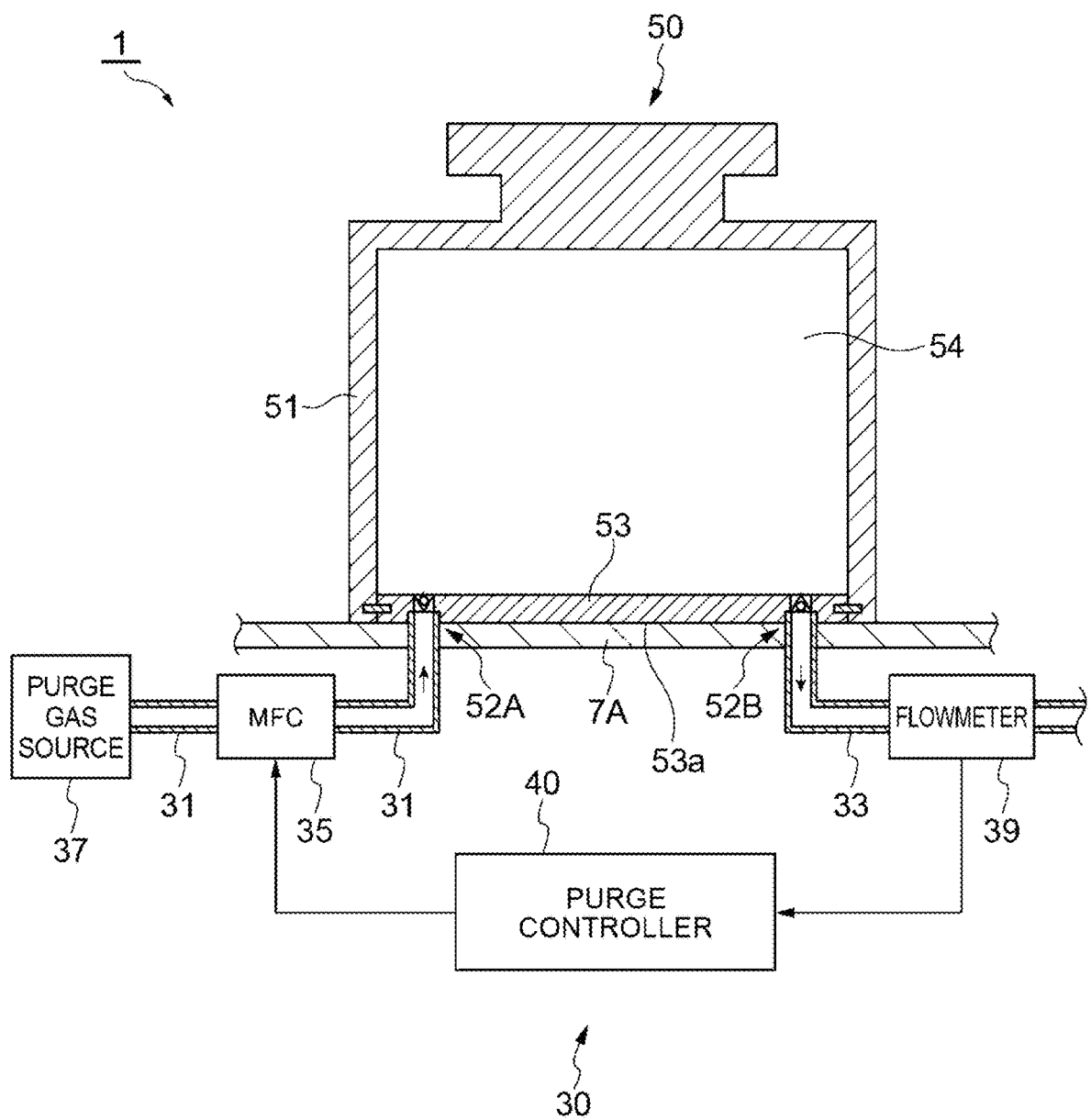
FIG. 2 is a schematic diagram illustrating a configuration of a purge device according to the example.

As illustrated in FIGS. 1 and 2, a purge stocker 1 purges the inside of a storage container 50 with purge gas, and also functions as a repository configured to store a plurality of the storage containers 50. Each storage container 50 is a container such as an SMIF pod or a reticle pod in which an object to be stored such as a semiconductor wafer or a glass substrate is stored. As the purge gas, for example, nitrogen gas or air is used. The purge stocker 1 is provided in a clean room, for example. The purge stocker 1 mainly includes a partition 3, racks 7, a crane 9, an overhead hoist transfer (OHT) port 21, and a manual port 23.

The partition 3 is a plate covering the purge stocker 1. Inside the partition 3, a storage area for storing the storage containers 50 are formed. The racks 7 are sections in which storage containers 50 are stored, and are provided in one or a plurality of rows (two rows) in the storage area. Each rack 7 extends in a certain direction x, and two adjacent racks 7, 7 are disposed parallel to each other to be opposed in a direction y. In each rack 7, a plurality of purge shelves 7A on which the respective storage containers 50 are placed to be stored are formed along the certain direction x and the vertical direction z. The purge shelves 7A are disposed to be aligned in plurality along the vertical direction z, and are also disposed to be aligned in plurality along the certain direction x.

The crane 9 is a conveying device configured to bring a storage container 50 onto and out from a purge shelf 7A, and also move a storage container 50 between a purge shelf 7A and each of the OHT port 21 and the manual port 23. The crane 9 is disposed in an area sandwiched between the opposed racks 7, 7. The crane 9 moves on a traveling rail (not illustrated) installed on a floor along the certain direction x in which the racks 7 extend. The crane 9 includes a guide rail 9A extending in the vertical direction z and a platform 9B configured to be movable up and down along the guide rail 9A. Conveyance of the storage containers 50 by the crane 9 is controlled by a crane controller 60. The crane controller 60 is an electronic control unit including a central processing unit (CPU), a read only memory (ROM), and a random access memory (RAM), for example.

The storage containers 50 are brought into and out from the purge stocker 1 through the OHT port 21 and the manual port 23. The OHT port 21 is a section where a storage container 50 is transferred between an overhead traveling vehicle (OHT) 27, which travels on a traveling rail 25 installed on a ceiling, and the purge stocker 1. The OHT port 21 includes a conveyor 21A configured to convey a storage container 50. The manual port 23 is a section where a storage container 50 is transferred between an operator and the purge stocker 1. The manual port 23 includes a conveyor 23A configured to convey a storage container 50.

The storage containers 50 will be specifically described. Each storage container 50 includes a container body 51 and a bottom lid 53. In the storage container 50, the bottom lid 53 is attached to and detached from the bottom side of the container body 51. The container body 51 has a rectangular box shape. The bottom lid 53 has a rectangular plate shape. In the storage container 50, a sealed space 54 is formed by the container body 51 and the bottom lid 53. In the sealed space 54, a plurality of semiconductor wafers (not illustrated) are stored.

Figure 3:
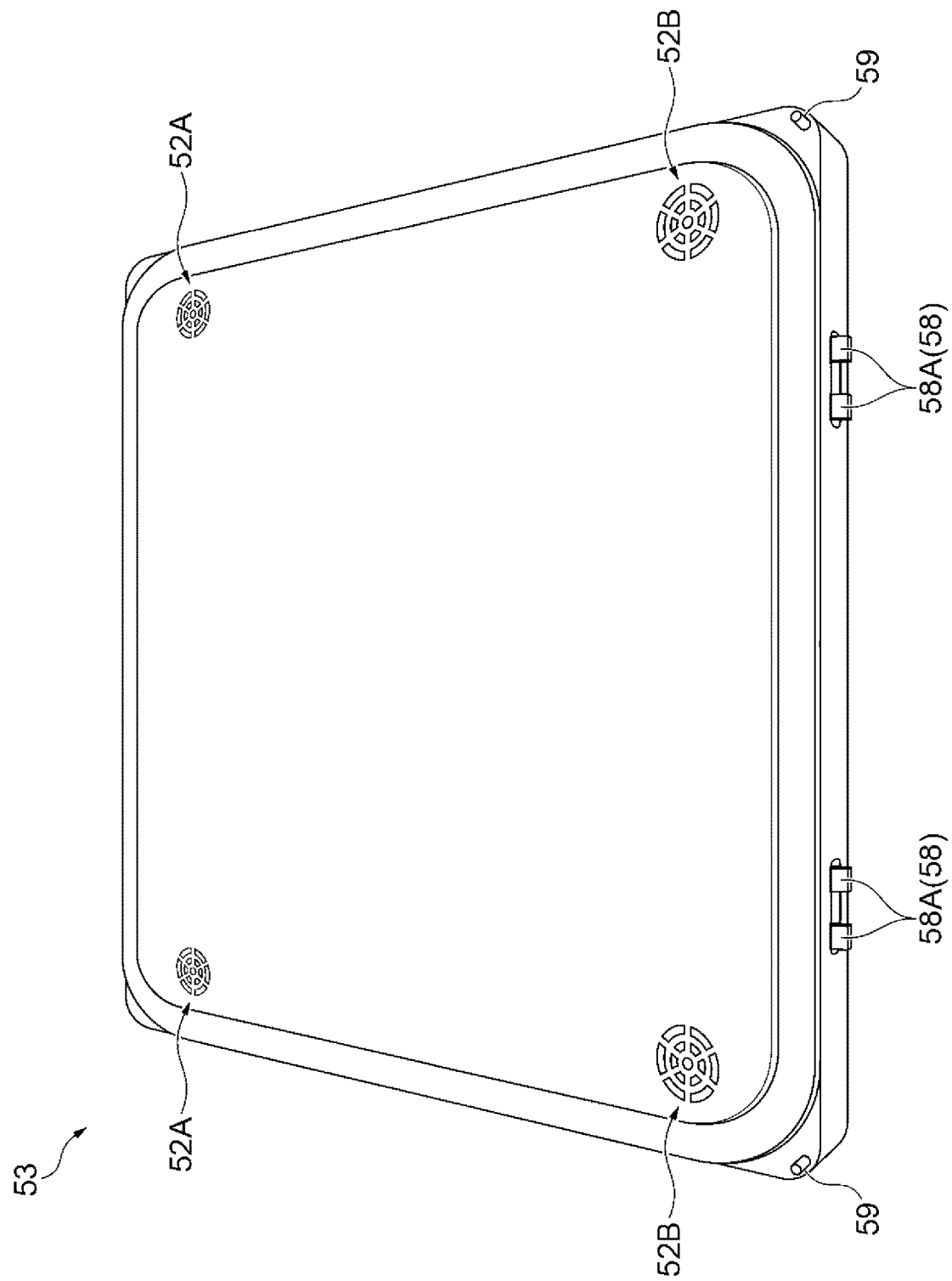
FIG. 3 is a perspective top view of a bottom lid of a storage container.
Figure 4:
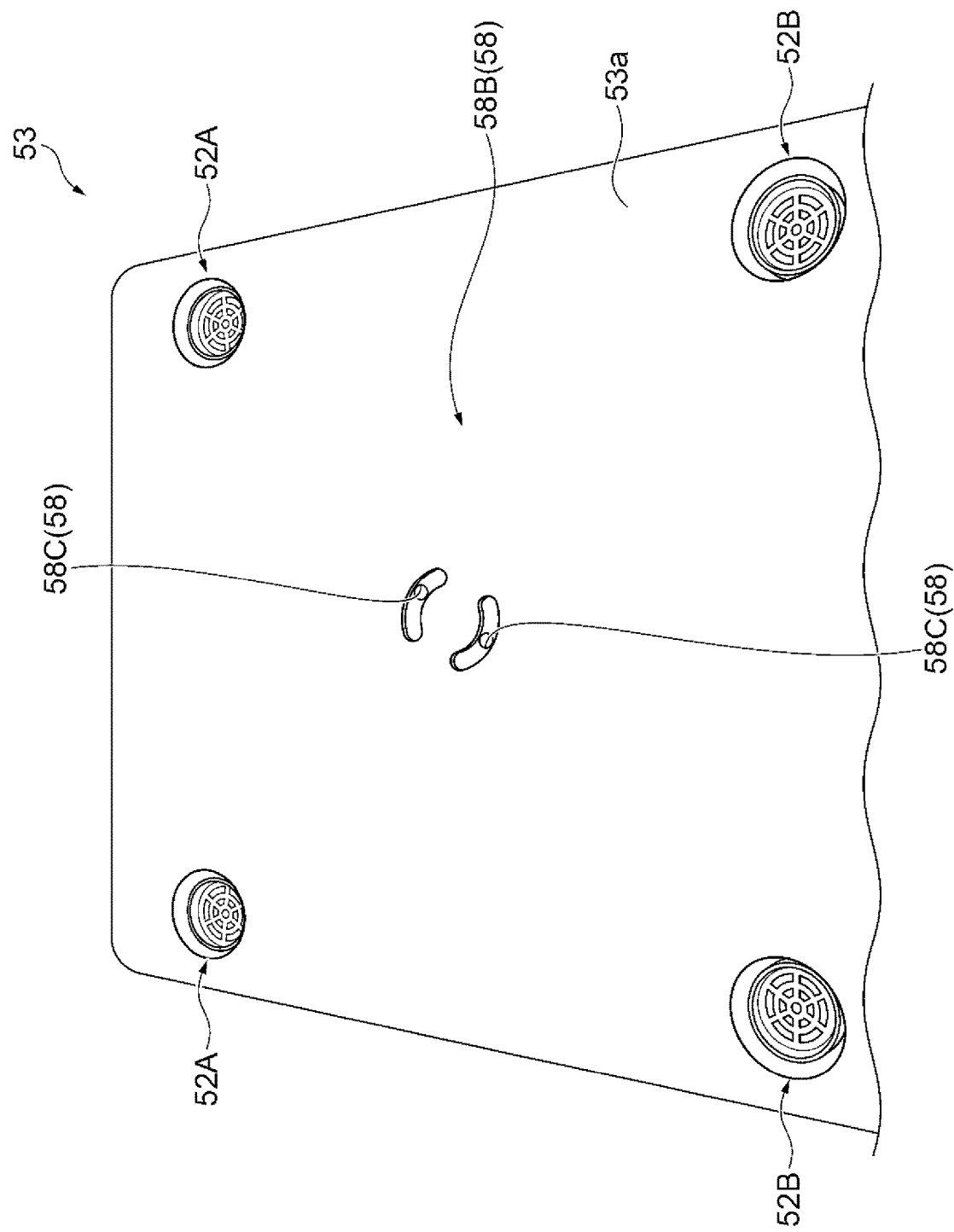
FIG. 4 is a perspective bottom view of the bottom lid of the storage container.

As illustrated in FIGS. 2, 3, and 4, in both left and right rear end portions of the bottom lid 53, injection ports 52A are provided. In both left and right front end portions of the bottom lid 53, discharge ports 52B are provide. Each injection port 52A is configured to be connectable to a nozzle, which is not illustrated, provided at a distal end of a supply pipe 31 of the purge device 30. Each discharge port 52B is configured to be connectable to a nozzle, which is not illustrated, provided at a distal end of a discharge pipe 33 of the purge device 30. In the injection port 52A and the discharge port 52B, check valves are provided. The "front" and the "rear" correspond to the near side and the far side of each purge shelf 7A, respectively, and the "left" and the "right" correspond to one side and the other side of a horizontal direction orthogonal to the front-and-rear direction, respectively.

The bottom lid 53 is provided with a latch mechanism 58, for example. The latch mechanism 58 includes latches 58A and a cam 58B. In the latch mechanism 58, when a key (not illustrated) is inserted into insertion holes 58C formed in a bottom surface 53a of the bottom lid 53 and this key is turned, the latches 58A are moved in and out (brought in and out) by the cam 58B. The latches 58A are provided on the front side and the rear side of the bottom lid 53. The latches 58A provided on the front side can protrude forward from the front surface of the bottom lid 53, and the latches 58A provided on the rear side can protrude backward from the rear surface of the bottom lid 53.

The latches 58A are fitted into fitting grooves 51A provided in the container body 51. By this fitting, the bottom lid 53 is fixed to the container body 51. In other words, the bottom lid 53 is attached to the container body 51 with the latches 58A. On two front corners of the four corners of the bottom lid 53, positioning projections 59 are formed upright. The positioning projections 59 are protrusions for positioning the bottom lid 53 with respect to the container body 51.

The purge device 30 will be specifically described. As illustrated in FIG. 2, the purge device 30 is a device configured to supply purge gas to the storage container 50 placed on the purge shelf 7A, and includes supply pipes 31, a mass flow controller (MFC) 35, a purge gas source 37, discharge pipes 33, a flowmeter 39, and a purge controller 40.

The supply pipes 31 are pipes for supplying purge gas, and are connected to the injection ports 52A of the bottom lid 53. The MFC 35 is an instrument configured to measure the mass flow rate of purge gas flowing through the supply pipes 31 to control the flow rate. The purge gas source 37 is a tank configured to store purge gas. The discharge pipes 33 are pipes for discharging purge gas, and are connected to the discharge ports 52B of the bottom lid 53. The flowmeter 39 is an instrument configured to measure the flow rate of purge gas flowing through the discharge pipes 33. The purge controller 40 controls various purging processes in the purge device 30. The purge controller 40 is an electronic control unit including a CPU, a ROM, and a RAM, for example.

The following describes the flow rate measurement device according to the example.

Figure 5:
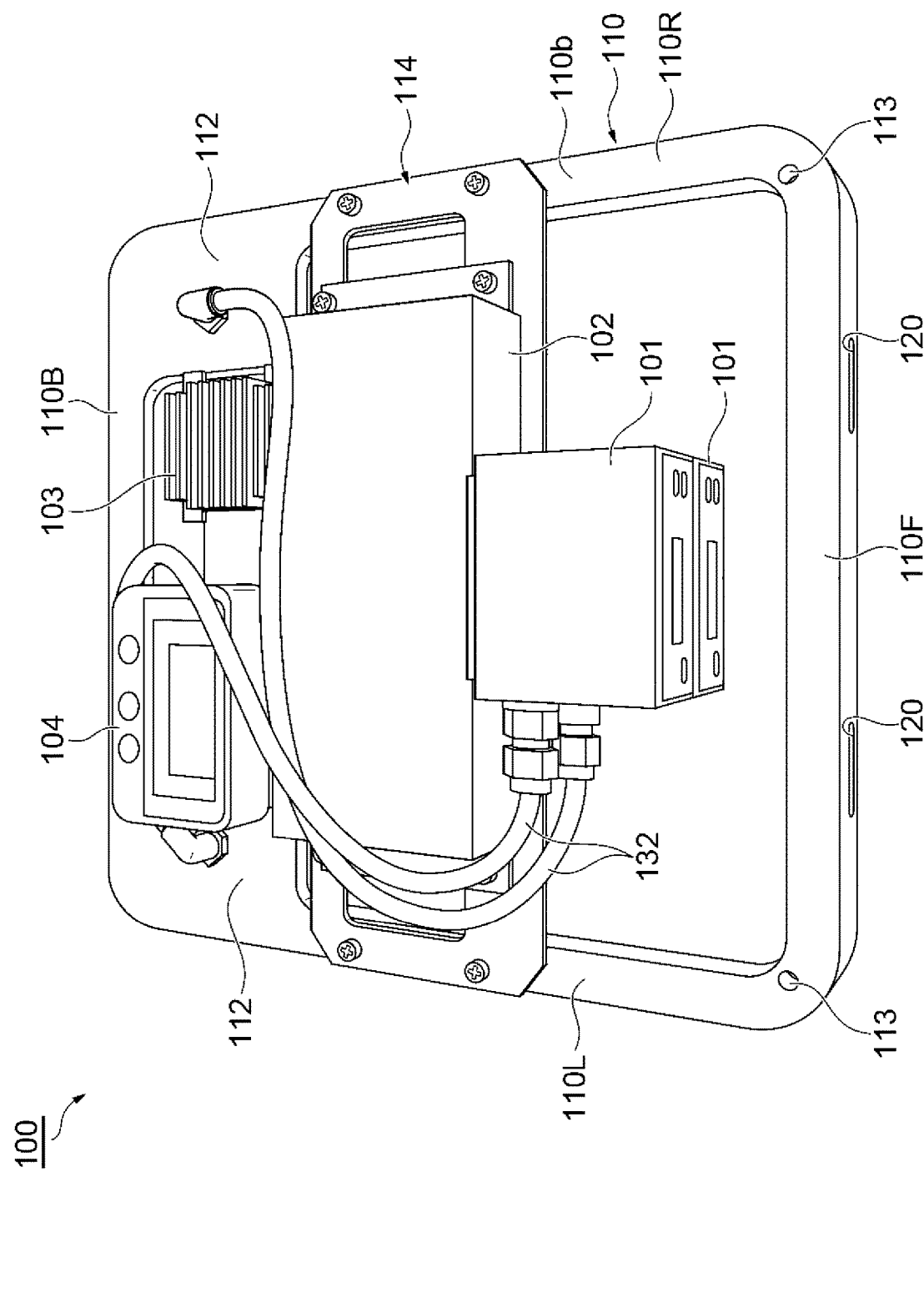
FIG. 5 is a perspective top view of a flow rate measurement device according to the example.
Figure 6:
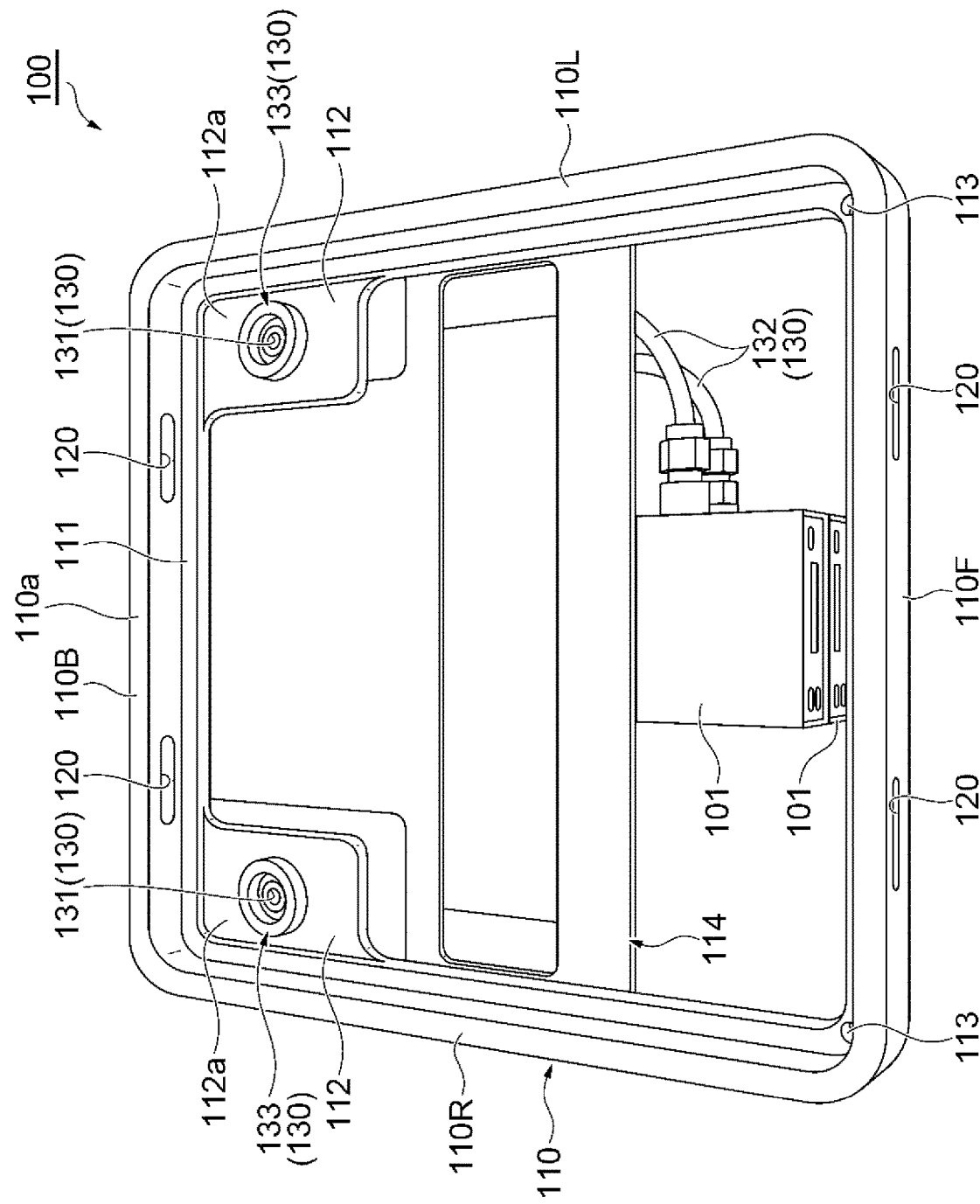
FIG. 6 is a perspective bottom view of the flow rate measurement device in FIG. 5.

As illustrated in FIGS. 5 and 6, a flow rate measurement device 100 is a device detachably attached to the bottom lid 53 and configured to measure the flow rate of purge gas in the purge device 30 by using the bottom lid 53. The flow rate measurement device 100 includes a frame 110 on which two flow-rate measurers 101 are mounted, long holes 120 provided in the frame 110, and flow passages 130 connected to the flow-rate measurers 101. The terms "upper" and "lower" correspond to the upper and lower directions in a state of being attached to the bottom lid 53.

Figure 7:
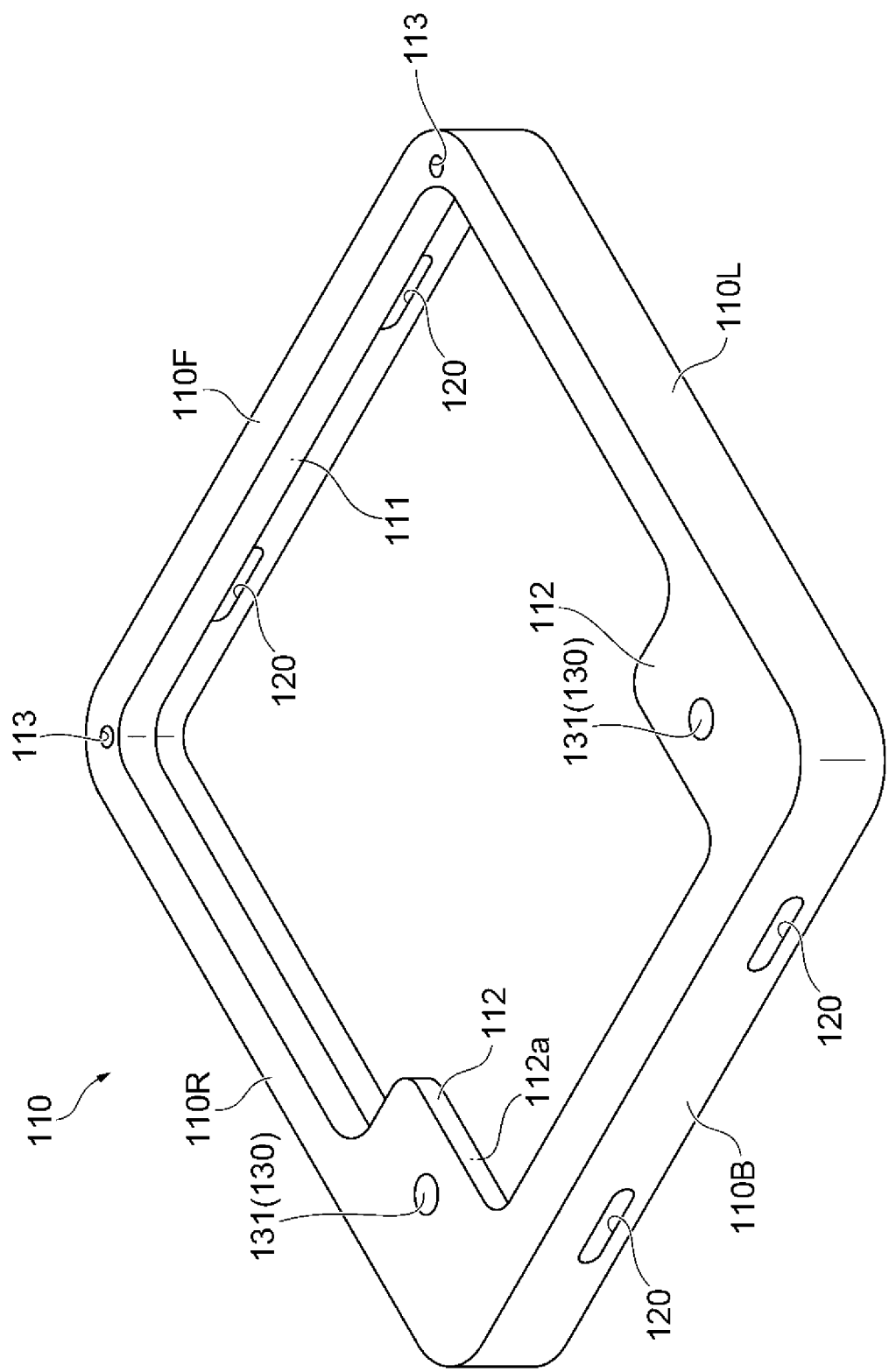
FIG. 7 is a perspective view illustrating a frame in FIG. 5.

As illustrated in FIGS. 5, 6, and 7, the frame 110 is a member having a frame shape corresponding to the outer shape of the bottom lid 53. The frame 110 has a rectangular frame shape. The frame 110 is formed of thermoplastic resin (such as polyacetal (POM)), for example. The frame 110 includes as its framework members a front ledge 110F, a rear ledge 110B, and side ledges 110L, 110R. The front ledge 110F and the rear ledge 110B are members extending along the left-and-right direction. The side ledges 110L, 110R are members extending along the front-and-rear direction. The side ledge 110L is continuous with the left ends of the front ledge 110F and the rear ledge 110B, and the side ledge 110R is continuous with the right ends of the front ledge 110F and the rear ledge 110B. The frame 110 constitutes the base.

The frame 110 is stacked on the bottom lid 53 to surround edges of the bottom lid 53. The frame 110 is stacked on the bottom lid 53 such that the bottom lid 53 is placed within its framework. When viewed from above, the outer shape of the frame 110 includes the outer shape of the bottom lid 53. The frame 110 has a stepped surface 111 at an inner peripheral portion of its lower surface 110a. The stepped surface 111 is a planar surface that extends inward with a step interposed therebetween above the lower surface 110a and is parallel to the lower surface 110a. The stepped surface 111 is brought into contact with the upper surface of the bottom lid 53 to restrict the upward movement of the bottom lid 53.

The frame 110 has overhangs 112 that are provided on the respective inner portions of the two rear corners to overhang inward. The overhangs 112 have a plate shape. The overhangs 112 are disposed opposite to the bottom lid 53 and located above the injection ports 52A when the frame 110 is stacked on the bottom lid 53. The upper surfaces of the overhangs 112 are continuous with an upper surface 110b of the frame 110. The lower surfaces of the overhangs 112 are planar surfaces that extend inward with steps interposed therebetween above the stepped surface 111 and are parallel to the lower surface 110a. The lower surfaces of the overhangs 112 constitutes pressing surfaces 112a configured to press inlet pads 133 against the bottom lid 53 as described later.

The frame 110 has positioning holes 113 into which the positioning projections 59 provided on the bottom lid 53 are inserted. The positioning holes 113 are formed in the two front corners of the four corners of the frame 110. The positioning holes 113 are through holes passing through vertically and each having a cross section corresponding to the shape of the positioning projections 59.

On the upper surface 110b of the frame 110, a plate member 114 is stacked and fixed. The plate member 114 supports various instruments mounted on the frame 110. The plate member 114 is formed of a material (such as metal) having a stiffness higher than that of the frame 110. The plate member 114 is disposed to extend over the rear ledge 110B and the side ledges 110L, 110R. On the plate member 114, two mass flowmeters 101, a battery 102, a converter 103, and a data logger 104 are fixed.

Each mass flowmeter 101 is an instrument configured to measure the flow rate of purge gas. The mass flowmeter 101 is not limited to a particular one, and various flowmeters may be used. The battery 102 is a storage battery configured to store electric power to be supplied to the mass flowmeters 101 and the data logger 104. The battery 102 is not limited to a particular one, and various batteries may be used. The converter 103 transforms the electric power from the battery 102 to supply the transformed electric power to the mass flowmeter 101 and the data logger 104. The converter 103 is a DC-DC converter, for example. The converter 103 is not limited to a particular one, and various converters may be used. The data logger 104 is a recorder configured to record results of measurements taken by the mass flowmeter 101. The data logger 104 is not limited to a particular one, and various data loggers may be used.

The long holes 120 are engaged parts formed in the frame 110 and configured to be engaged with the latches 58A (see FIG. 3) inserted thereinto. In other words, the latches 58A are fitted into the long holes 120 when the frame 110 is stacked on the bottom lid 53. The long holes 120 are formed in the front ledge 110F and the rear ledge 110B of the frame 110. Each long hole 120 is a hole, the longitudinal direction of which corresponds to the left-and-right direction, penetrating in the front-and-rear direction. The long holes 120 have a vertical width corresponding to the vertical width of the latches 58A. When the frame 110 is stacked on the bottom lid 53, the long holes 120 are disposed opposite in the front-and-rear direction to the latches 58A not protruding from the bottom lid 53. The long holes 120 are provided, the number of which is the same as or more than that of the latches 58A.

The flow passages 130 allow purge gas injected from the injection ports 52A of the bottom lid 53 to circulate therethrough to the flow-rate measurers 101 in a state in which the frame 110 is stacked on the bottom lid 53 and the long holes 120 are engaged with the latches 58A of the bottom lid 53 ("engaged state of the frame 110"). Each flow passage 130 includes a vent hole 131, a tube 132, and the corresponding inlet pad 133.

The vent hole 131 is a through hole formed in the corresponding overhang 112. The vent hole 131 communicates with the corresponding injection port 52A of the bottom lid 53 in the engaged state of the frame 110. One end of the tube 132 is connected to the corresponding flow-rate measurer 101. The other end of the tube 132 is connected to the upper end of the vent hole 131.

Figure 8:
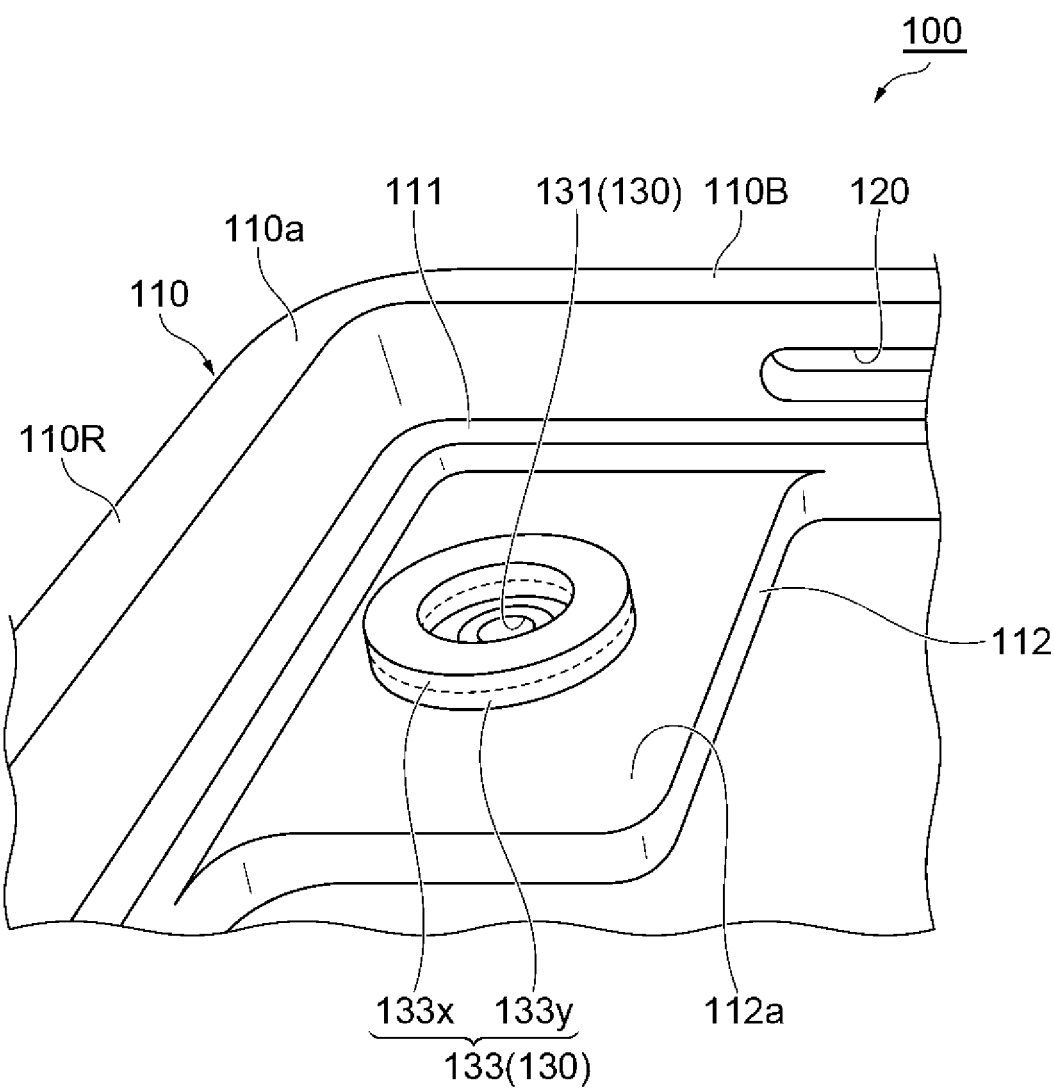
FIG. 8 is a perspective view illustrating an inlet pad in FIG. 6 in an enlarged manner.
Figure 10:
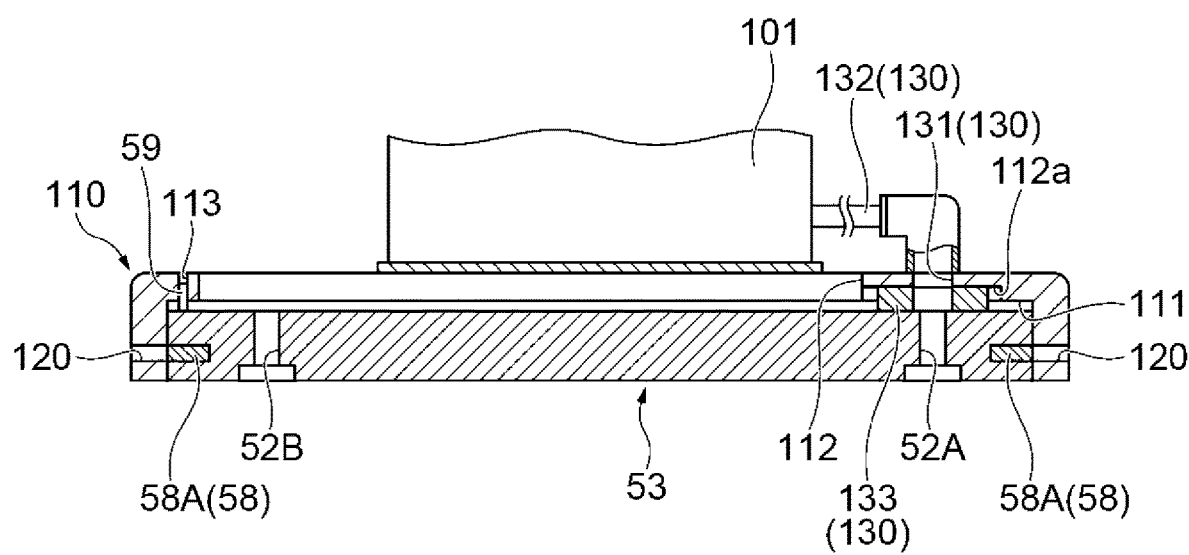
FIG. 10 is a cross-sectional side view illustrating a continuation of FIG. 9.

The inlet pad 133 is brought into intimate contact with the rim of the injection port 52A on the upper surface of the bottom lid 53 in the engaged state of the frame 110 (see FIG. 10). The inlet pad 133 is a ring-shaped member. As illustrated in FIG. 8, the inlet pad 133 is provided on the lower surface of the overhang 112 to surround the vent hole 131 when viewed from below. The inlet pad 133 includes: a first layer 133x provided on a side closer to the injection port 52A (lower side) and made of elastic material; and a second layer 133y provided on a side closer to the overhang 112 (upper side) and made of gel material. The first layer 133x and the second layer 133y are stacked on one another. The first layer 133x is formed of polyurethane rubber, for example. The second layer 133y is formed of a gel material containing silicone as a main raw material and having high flexibility.

Figure 9:
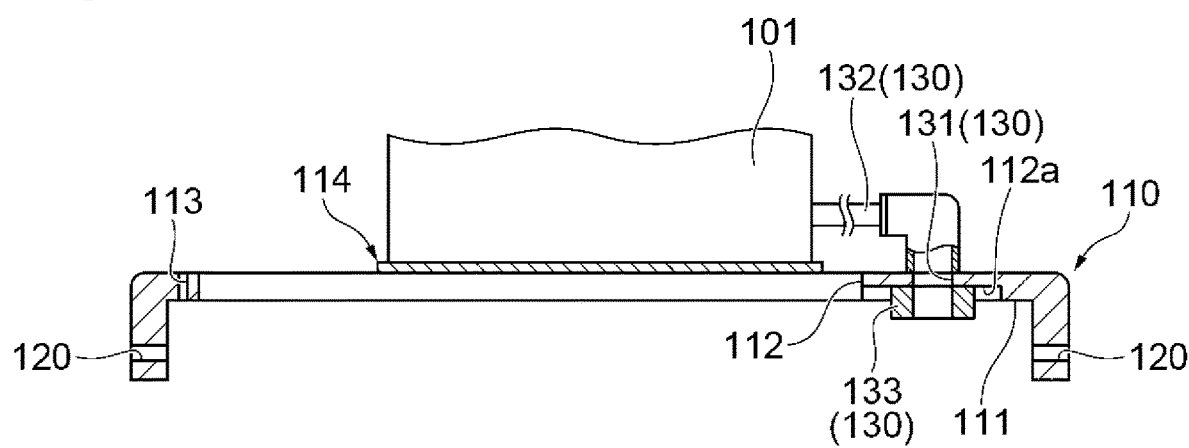
FIG. 9 is a cross-sectional side view schematically illustrating an example of attaching the flow rate measurement device in FIG. 5 onto the bottom lid.
Figure 9:
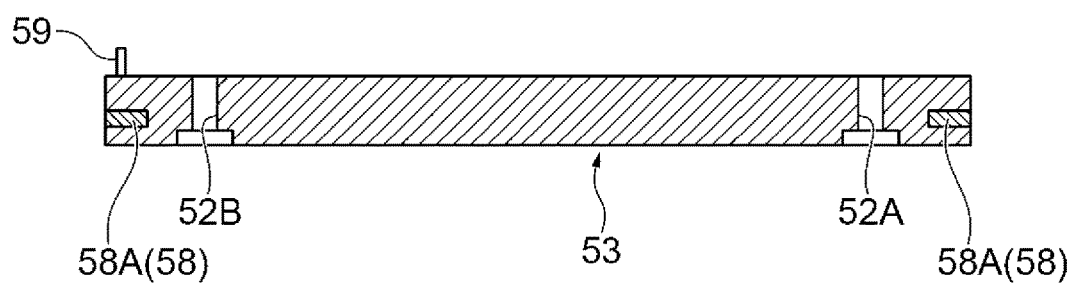

When the flow rate measurement device 100 configured as described above is attached to the bottom lid 53, for example, an operator positions the flow rate measurement device 100 above the bottom lid 53 as illustrated in FIG. 9. At this time, the front-and-rear orientation of the flow rate measurement device 100 is aligned such that the positioning holes 113 are positioned above the positioning projections 59. The latches 58A are set in a state of not protruding from the bottom lid 53.

Subsequently, the operator stacks the frame 110 on the bottom lid 53 such that it surrounds the edges of the bottom lid 53 as illustrated in FIG. 10, and connects the vent holes 131 to the injection ports 52A with the inlet pads 133 interposed therebetween. At this time, the positioning projections 59 are inserted into the positioning holes 113. The inlet pads 133 are brought into intimate contact with the rims of the injection ports 52A, and the inlet pads 133 are pressed against the bottom lid 53 by the pressing surfaces 112a of the overhangs 112, whereby the inlet pads 133 are deformed to be compressed vertically.

Figure 11:
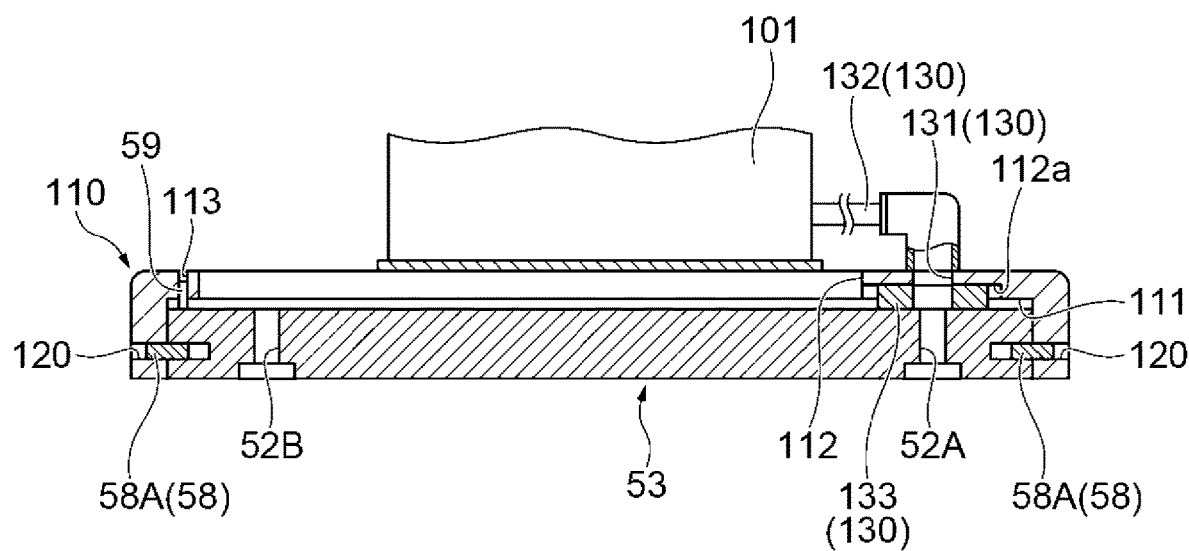
FIG. 11 is a cross-sectional side view illustrating a continuation of FIG. 10.

Subsequently, the operator inserts the key into the insertion holes 58C (see FIG. 4) of the bottom lid 53 and turns the key, thereby causing the cam 58B to protrude the latches 58A from the bottom lid 53 as illustrated in FIG. 11. By this operation, the latches 58A are inserted and fitted into the long holes 120. Consequently, the frame 110 is engaged with the bottom lid 53, whereby attachment of the flow rate measurement device 100 to the bottom lid 53 is completed.

In the same manner as for each storage container 50, the flow rate measurement device 100 attached to the bottom lid 53 is brought in and out from the purge shelves 7A in a predetermined order by the crane 9, and when placed on each purge shelf 7A, purge gas is supplied thereto by the purge device 30. The flow rate measurement device 100 attached to the bottom lid 53 measures the flow rate of the purge gas with the mass flowmeters 101, and records the measurement results in the data logger 104.

When the flow rate measurement device 100 is then removed from the bottom lid 53, the operator inserts the key into the insertion holes 58C of the bottom lid 53 and turns the key, thereby causing the cam 58B to retract the latches 58A into the bottom lid 53 and withdrawing the latches 58A from the long holes 120 to release the engagement. The operator then lifts the flow rate measurement device 100 upward and pulls out the positioning projections 59 from the positioning holes 113 to complete the removal.

With the flow rate measurement device 100 described above, when the long holes 120 are engaged with the bottom lid 53 and the flow rate measurement device 100 is attached to the bottom lid 53, the flow rate of purge gas in the purge device 30 can be measured by effectively utilizing an existing function of the injection ports 52A, for example, of the bottom lid 53. Thus, the flow rate of purge gas in the purge device 30 can be easily measured. The flow rate measurement device 100 can also be attached to another bottom lid different from the bottom lid 53, and thus versatility can be increased.

In the flow rate measurement device 100, the long holes 120 are engaged with the latches 58A configured to attach the bottom lid 53 to the container body 51. In this example, the long holes 120 can be engaged with the bottom lid 53 by effectively utilizing the latches 58A of the bottom lid 53. The flow rate measurement device 100 can be easily attached to the bottom lid 53.

In the flow rate measurement device 100, the frame 110 has a frame shape corresponding to the outer shape of the bottom lid 53 and is stacked on the bottom lid 53 to surround the edges of the bottom lid 53. In the frame 110, the long holes 120 into which the latches 58A are inserted are formed. In this example, the configuration in which the long holes 120 are engaged with the bottom lid 53 by effectively utilizing the latches can be concretely implemented.

In the flow rate measurement device 100, the frame 110 has the stepped surface 111 configured to be brought into contact with the upper surface of the bottom lid 53 to restrict the upward movement of the bottom lid 53. In this example, the bottom lid 53 can be prevented from moving upward away from the frame 110, and thus the long holes 120 can be easily engaged with the bottom lid 53.

In the flow rate measurement device 100, the flow passages 130 include the inlet pads 133 configured to be brought into intimate contact with the rims of the injection ports 52A on the upper surface of the bottom lid 53 when the long holes 120 are engaged with the bottom lid 53. In this example, airtightness between each injection port 52A and the corresponding vent hole 131 can be ensured to prevent leakage of purge gas from between the injection port 52A and the vent hole 131, and thus the flow rate of purge gas can be reliably measured.

In the flow rate measurement device 100, each inlet pad 133 includes the first layer 133x made of elastic material and the second layer 133y made of gel material. In this example, leakage of purge gas from between the injection port 52A and the vent hole 131 can be further prevented, and thus the flow rate of purge gas can be more reliably measured.

In the flow rate measurement device 100, the frame 110 has the pressing surfaces 112a configured to press the inlet pads 133 against the bottom lid 53 when the long holes 120 are engaged with the bottom lid 53. In this example, leakage of purge gas from between the injection port 52A and the vent hole 131 can be further prevented, and thus the flow rate of purge gas can be more reliably measured.

In the flow rate measurement device 100, in the frame 110, the positioning holes 113 into which the positioning projections 59 provided on the bottom lid 53 are inserted are formed. In this example, the bottom lid 53 can be positioned with respect to the frame 110.

Although the example has been described above, this disclosure is not limited to the above example. In the above example, various modifications can be made within the scope not departing from this disclosure.

In the above example, the positioning projections 59 are provided on the bottom lid 53, and the positioning holes 113 are formed in the frame 110 into which they are inserted. However, instead of or in addition to these, positioning holes may be provided in the bottom lid 53, and positioning projections configured to be inserted thereinto may be formed on the frame 110.

In the above example, the long holes 120 are formed as engaged parts. However, the engaged parts are not limited to the long holes 120. The engaged parts may be holes having other shapes such as round holes, may be grooves, or may be protrusions. In short, the engaged parts only need to have a configuration in which the engaged parts can be engaged with the bottom lid 53. In the above example, the engaged parts are engaged with the latches 58A of the bottom lid 53, but may be engaged with engaging parts other than the latches 58A.

In the above example, the frame 110 is included as the base. However, the base may have another configuration other than the frame 110. The shape of the frame 110 is not limited to a rectangular frame shape, and may be of various frame shapes. In the above example, each inlet pad 133 does not have to include a plurality of layers, and may be formed of a single material.

The materials and shapes of the respective configurations in the example and the modifications above are not limited to those described above, and various materials and shapes may be used. Each configuration in the example or the modifications above may be optionally applied to each configuration in other examples or modifications. Some of the respective configurations in the example or the modifications above may be omitted as appropriate within the scope not departing from the scope of this disclosure.

The invention claimed is:

1. A flow rate measurement device configured to measure a flow rate of purge gas in a purge device configured to supply the purge gas to a container including a bottom lid configured to be attached to and detached from a container body, the flow rate measurement device comprising:
    a base on which a flow-rate measurer is mounted;
    an engaged part provided in the base and configured to be engaged with the bottom lid; and
    a flow passage through which the purge gas injected from an injection port of the bottom lid is circulated to the flow-rate measurer when the engaged part is engaged with the bottom lid.

2. The flow rate measurement device according to claim 1, wherein
    the bottom lid includes a latch and is attached to the container body with the latch, and
    the engaged part is engaged with the latch.

3. The flow rate measurement device according to claim 2, wherein
    the base includes a frame having a frame shape corresponding to an outer shape of the bottom lid and configured to be stacked on the bottom lid to surround an edge of the bottom lid, and
    the engaged part is a hole or a groove, formed in the frame, into which the latch is inserted.

4. The flow rate measurement device according to claim 3, wherein the frame has a stepped surface configured to be brought into contact with an upper surface of the bottom lid to restrict upward movement of the bottom lid.

5. The flow rate measurement device according to claim 1, wherein the flow passage includes an inlet pad configured to be brought into contact with a rim of the injection port on the upper surface of the bottom lid when the engaged part is engaged with the bottom lid.

6. The flow rate measurement device according to claim 5, wherein the inlet pad includes a first layer provided on a side closer to the injection port and made of elastic material and a second layer stacked on the first layer and made of gel material.

7. The flow rate measurement device according to claim 5, wherein the base has a pressing surface disposed opposite the bottom lid and configured to press the inlet pad, which is in contact with the rim of the injection port, against the bottom lid when the engaged part is engaged with the bottom lid.

8. The flow rate measurement device according to claim 1, wherein, in the base, at least one of a positioning hole into which a positioning projection provided on the bottom lid is inserted and a positioning projection configured to be inserted into a positioning hole provided in the bottom lid is formed.

* * * * *